United States Patent [19]

Brookshire

[11] Patent Number: 4,565,971
[45] Date of Patent: Jan. 21, 1986

[54] PARASITIC INSENSITIVE AUTO-ZEROED OPERATIONAL AMPLIFIER

[75] Inventor: Daniel A. Brookshire, Manor, Tex.

[73] Assignee: Motorola, Inc., Schaumburg, Ill.

[21] Appl. No.: 695,644

[22] Filed: Jan. 28, 1985

[51] Int. Cl.⁴ .......................... H03F 1/02; H03F 1/14
[52] U.S. Cl. ............................................ 330/9; 330/51
[58] Field of Search .................. 330/9, 51, 107, 109, 330/149; 333/173; 307/352, 353

[56] References Cited

U.S. PATENT DOCUMENTS

| 4,306,196 | 12/1981 | Dwarakanath et al. | 330/9 |
| 4,404,525 | 9/1984 | Amir et al. | 330/9 |
| 4,429,282 | 1/1984 | Saari | 330/9 |
| 4,430,622 | 2/1984 | Simoes | 330/9 |
| 4,439,693 | 3/1984 | Lucas et al. | 307/353 |

OTHER PUBLICATIONS

Sheu, Bing J., and Hu, Chemming, "Switch-Induced Error Voltage on a Switched Capacitor", *IEEE J. SS. Ekts.*, vol. SC-19, No. 4, Aug. 1984, pp. 519-525.

*Primary Examiner*—James B. Mullins
*Assistant Examiner*—Steven J. Mottola
*Attorney, Agent, or Firm*—Anthony J. Sarli, Jr.; Jeffrey Van Myers; Robert L. King

[57] ABSTRACT

An operational amplifier circuit which is substantially insensitive to inherent parasitic capacitance associated therewith is provided. An error voltage resulting from the parasitic capacitance is typically coupled onto a capacitor which is connected to a first input of an operational amplifier. To compensate for the error voltage, a substantially identical second error voltage is created and coupled to a second input of the operational amplifier, thereby cancelling the effects of the first error voltage.

8 Claims, 3 Drawing Figures

PARASITIC INSENSITIVE AUTO-ZEROED OPERATIONAL AMPLIFIER

TECHNICAL FIELD

This invention relates generally to operational amplifier circuits and, more particularly, to an operational amplifier circuit which is substantially parasitic insensitive.

BACKGROUND ART

Various voltage errors are associated with oerational amplifier circuits, including voltage errors resulting from parasitics capacitances associated with both nodal connections and the devices used to implement the circuits. A common parasitic-sensitive node of a differential amplifier is the input node which is selectively coupled directly to an output of the differential amplifier. A conventional method for compensating an offset voltage error associated with a differential amplifier is to periodically directly connect the output thereof to one of the inputs. Offset voltage compensation of this type automatically zeroes out offset voltage and such amplifier structures are commonly known as autozeroed operational amplifiers. However, due to parasitics associated with the switch used to implement the autozeroing and parasitics associated with the autozeroed node, a voltage error which is in addition to any offset voltage error is introduced at the input of the differential amplifier at the time of charge equalization between the input and output of the differential amplifier. Error voltages resulting from parasitic capacitance associated with electronic switches are well known as documented by Bing J. Sheu et al. in an article entitled, "Switch-Induced Error Voltage on a Switched Capacitor", in IEEE *Journal of Solid-State Circuits,* Vol. SC-19, No. 4, August 1984, pp. 519–525. Others have attempted to compensate for parasitic related voltage errors by using an electronic switch which has additional compensation circuitry associated therewith to minimize parasitic related voltage errors. However, although such compensated switches substantially null parasitic errors created by the switch's internal parasitics, additional circuitry is required to implement the compensation while the number of devices connected to the input node has increased. As a result, the parasitic capacitance on the input node itself has been increased. Others who have used conventional CMOS swtiches have also attempted to adjust the width of the control electrodes of the transistors associated therewith so that P-channel device parasitics cancel N-channel device parasitics. However, exact matching of device characteristics is never acheivable due to processing variables.

SUMMARY OF THE INVENTION

It is an object of the present invention to provide an improved parasitic insensitive operational amplifier circuit.

Another object of the present invention is to provide an improved auto-zeroed operational amplifier circuit having minimal parasitic voltage error.

A further object of the present invention is to provide an improved operational amplifier sample and hold circuit which minimizes voltage errors created by parasitic voltages.

Yet another object of the present invention is to an improved method for selectively sampling and holding an input voltage in an operational amplifier which minimizes both offset voltage errors and output voltage errors resulting from parasitic nodal connections.

In carrying out the above and other objects of the present invention, there is provided, in one form, an operational amplifier circuit with a first input having parasitic capacitance associated therewith which induces an error voltage at an output of the operational amplifier. The operational amplifier has a second input which is selectively coupled to a reference voltage terminal. To correct the error voltage at the output of the operational amplifier, a parasitic compensation circuit is provided for compensating for the parasitic error voltage. The parasitic compensation circuit comprises parasitic charge compensation means coupled to the second input of the operational amplifier, for selectively coupling an amount of charge equal to parasitic charge associated with the first input of the operational amplifier to the second input of the operational amplifier.

The above and other objects, features and advantages of the present invention will be more clearly understood from the following detailed description taken in conjunction with the following drawings.

DETAILED DESCRIPTION OF THE PRESENT INVENTION

Figure 1:
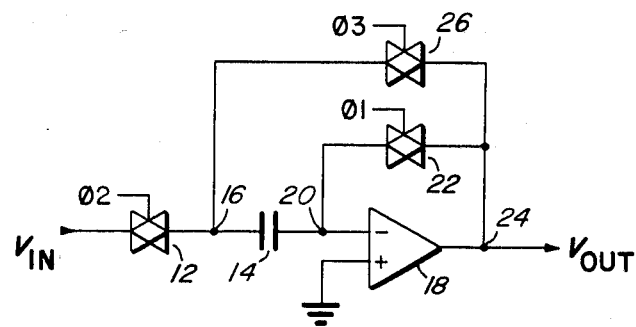
FIG. 1 illustrates in schematic form an operational amplifier circuit known in the art.

Shown in FIG. 1 is a conventional auto-zeroed operational amplifier circuit 10 known in the art for performing a sample and hold operation of an input voltage $V_{IN}$. A switch 12 has a first terminal for receiving the input voltage and a second terminal connected to a first electrode of a capacitor 14 at a node 16. A clock signal labeled $\emptyset_2$ is coupled to a control electrode of switch 12. A second electrode of capacitor 14 is connected to a negative or inverting input of an operational amplifier 18 at a node 20. A positive or noninverting input of operational amplifier 18 is connected to a reference ground potential. A switch 22 has a first terminal connected to the negative input of operational amplifier 18 and a second terminal connected to an output of operational amplifier 18 at an output node 24 for providing an output voltage $V_{OUT}$. A switch 26 has a first terminal connected to node 16 and a second terminal connected to terminal 24. A clock signal labeled $\emptyset_1$ is coupled to switch 22, and a clock signal labeled $\emptyset_2$ is coupled to swtich 26. It should be well understood that although switches, 12, 22 and 26 will be discussed as being implemented by conventional CMOS transmission gate clocked in a conventional manner and using two transistors of opposite conductivity types, the problems inherent in the prior art and the advantages provided by the present invention exist regardless of the type of switches used.

Figure 2:
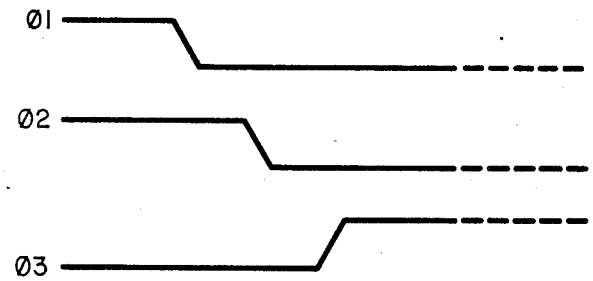
FIG. 2 illustrates in graphical form waveforms associated with the circuits of FIGS. 1 and 3.

Referring to the clock signals of FIG 2, the operation of operational amplifier 10 of FIG. 1 may be readily seen to effect a sample and hold operation after an initial autozero period. When clock signals $\emptyset_1$ and $\emptyset_2$ both at high logic levels, operational amplifier 18 is being autozeroed by having the output connected to the negative input to automatically zero out or equalize any offset voltage associated with the operational amplifier. The autozeroing is accomplished by charging the offset voltage at the output of operational amplifier 18 onto capacitor 14 while also charging the input voltage $V_{IN}$ onto capacitor 14. After a predetermined amount of time, switch 22 decouples the output from input node 20. After switch 22 is made nonconductive, switch 12 is made nonconductive to decouple the input voltage from circuit 10. Then clock signal $\emptyset_3$ makes switch 26 conductive to couple an opposite electrode of capacitor 14 to the output of operational amplifier 18. The offset voltage which was initially charged onto capacitor 14 cancels the offset voltage at the output of operational amplifier 18 when capacitor 14 is switched in this manner. Therefore, an input voltage $V_{IN}$ has been sampled and held by circuit 10 and provided at node 24 without the offset voltage of operational amplifier 18 substantially distorting the stored vlaue. Other variations of auto-zeroing operational amplifiers are well known such as the auto-zeroing circuit taught by Kelly et al. in U.S. Pat. No. 4,355,285 and assigned to the asignee hereof.

In the illustrated form, circuit 10 does not provide a correct valved output voltage because of parasitic voltage erros associated with node 20 and switch 22 which are coupled to the output voltage along with the sampled input voltage. Parasitic capacitance exists primarily due to parasitics associated with transistors used to implement switch 22. The parasitic capacitance associated with a transistor is largely due to capacitance resulting from gate to drain electrode overlapping of semiconductor material which is impossible to eliminate as a practical matter. To compensate for this parasitic capacitance, others have adjusted the transistor gate electrode widths in an attempt to cancel the charge of P-channel and N-channel transistors and make the control voltages on the control electrodes equal. Processing variations generally make this solution unacceptable for most applications. An additional switch may be coupled to the negative input of operational amplifier 18 in an attempt to exactly cancel the parasitic charges associated with switch 22. Such a circuit is taught by Amir et al. in U.S. Pat. No. 4,404,525. However, the connection of an additional switch to the negative input of an operational amplifier slows the feedback loop response to the operational amplifier and doubles the parasitic capacitance at the input node itself. Also, an additional switch at node 20 would not exactly cancel the error voltage introduced at node 20 due to extra charge created by both switches before and after becoming conductive.

Figure 3:
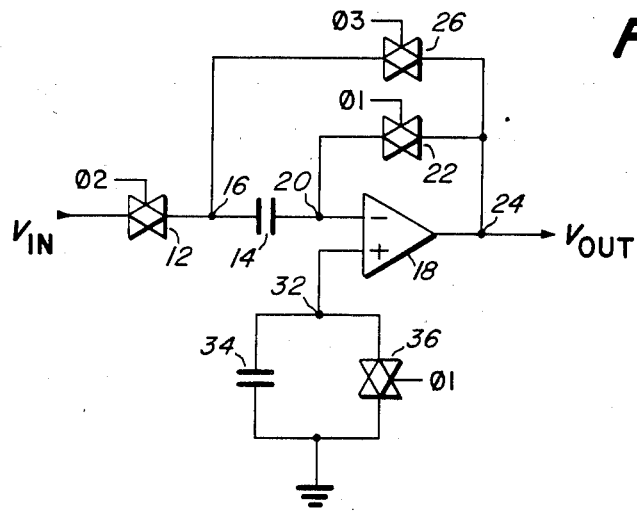
FIG. 3 illustrates in schematic form an embodiment of an operational amplifier circuit in accordance with the present invention.

Referring to FIG. 3, an operational amplifier circuit 10' illustrates a preferred embodiment of the present invention. Elements which are common with operational amplifier circuit 10 of FIG. 1 are numbered the same. Operational amplifier 18 has the positive or noninverting input coupled at a node 32 to a first electrode of a capacitor 34 and to a first terminal of a switch 36. A second electrode of capacitor 34 and a second terminal of switch 36 are connected together and to the reference ground potential. Clock signal $\emptyset_1$ is coupled to a control electrode of switch 36. The valve of capacitor 34 is made identical to the value of capacitor 14.

In operation, circuit 10' functions with the use of control signals $\emptyset_1$, $\emptyset_2$ and $\emptyset_3$ of FIG. 2 to sample and hold an input signal $V_{IN}$ and provide an output voltage $V_{OUT}$ which contains substantially no voltage error due to offset voltage or parasitics. a parasitic cancellation network in the form of capacitor 34 and switch 36 has been connected to the noninverting input of operational amplifier 18 to exactly match and offset the effects of parasitic capacitance connected to the inverting input of operational amplifier 18. Initially, operational amplifier 18 is connected to an input voltage $V_{IN}$ via switch 12 and is connected in an auto-zeroing mode by switch 22. Simultaneously, switch 36 is conductive to connect the noninverting input to reference ground voltage potential as in the circuit of FIG.1. However, whenever signal $\emptyset_1$ transitions to a low logic level, both switches 22 and 36 become nonconductive. parasitics associated with both switches 22 and 36 will be charged onto capacitors 14 and 34, respectively. The parasitic voltage stored by each of capacitors 14 and 34 will be equal if capacitors 14 and 34 and switches 22 and 36 are respectively made identical to each other. Capacitors can be accurately matched in value in most semiconductor processes. Switches 22 and 36 can also be made substantially identical since both switches are made in the same process. Therfore, process variations will not affect the parasitic cancellation of the present invention. When switch 12 becomes nonconductive and switch 26 is made conductive, the output voltage at node 24 will be substantially equal to the input voltage with no error voltage introduced. Parasitics associated with switch 22 are cancelled by the application of an equal amount of parasitic related voltage to the noninverting input of operational amplifier 18. Note that parasitic voltage error cancellation is effected for both D.C. steady state voltages and dynamic input voltages. Offset erros voltage has been corrected by the auto-zeroing function is a conventional manner.

By now it should be apparent that in the illustrated form an operational amplifier circuit which samples and holds an input voltage and selectively provides an output voltage having substantially no offset voltage and no parasitic voltage errors has been taught. Parasitic voltages associated with the inverting input node have been compensated without the coupling of additional circuitry to the inventing input node. As a result, the inverting input node remains minimally loaded and operational amplifier feedback loop response is not slowed by the parasitic voltage compensation. Because switches 22 and 36 may be fabricated in the same process, process variations do not affect the performance of the present invention. Further, it should be realized that the present invention may be implemented with any type of switching structure and is not limited to the use of CMOS transmission gates. It should also be apparent that the present invention may be utilized with numerous variations of differential input operational amplifier circuits and is not expressly limited to an auto-zeroed operational amplifier because parasitic capacitances are introduced at an input of any operational amplifier any time any type of circuit component is connected to the input. Therefore, to compensate for the resulting voltage error, a proportional number of similar circuit components must be connected to the other input of the operational amplifier in a manner so that the total capacitive parasitic charge coupled to both inputs is equal.

I claim:

1. In combination with a differential input operational amplifier citcuit having an operational amplifier with a negative input having parasitic capacitance associated therewith which induces an error voltage at an output of the operational amplifier, and a positive input adpated to be coupled to a reference voltage, a parasitic compensation circuit for compensating for the parasitic error voltage induced by said parasitic capacitance, comprising:

first switching means for selectively auto-zeroing the operational amplifier;

first capacitance means having a first electrode coupled to the negative input of the operational amplifier and a second electrode, for selectively storing an input voltage and a first parasitic error voltage;

second switching means for selectively coupling the second electrode of the first capacitance means to the output of the operational amplifier;

third switching means coupled between the positive input of the operational amplifier and a reference voltage terminal, for selectively coupling the operational amplifier to the reference voltage terminal; and second capacitance means having a capacitance proportional to the first capacitance means and coupled between the positive input of the operational amplifier and the reference voltage terminal, for selectively storing and coupling a second perasitic voltage substantially equal to the first parasitic voltage to the positive input of the operational amplifier.

2. The parasitic compensation circuit of claim 1 wherein the first and third switching means are controlled by a first clock signal and the second swtiching means is controlled by a second clock signal, said first and second clock signals being nonoverlapping clock signals.

3. In an auto-zeroed operational amplifier circuit comprising:

an operational amplifier with a negative input having parasitic capacitance associated therewith which induces an error voltage on an output of the operational amplifier, said output providing an inverted output of an input voltage, and a positive input adapted to be coupled to a reference voltage terminal;

first charge storage means having a first electrode connected to the negative input of the operational amplifier, and a second electrode selectively coupled to the input voltage, said first charge storage means contributing a first parasitic capacitance to the negative input of the operational amplifier;

first switching means having a first terminal connected to the negative input of the operational amplifier, and a second terminal connected to the output of the operational amplifier, for selectively connecting the output and negative input of the operational amplifier to auto-zero the operational amplifier, said first switching means contributing a second parasitic capacitance to the first input of the operational amplifier;

second swtiching means having a first terminal connected to the second electrode of the first charge storage means, and a second terminal connected to the output of the operational amplifier, for selectively coupling the second electrode of the first charge storage means to the output of the operational amplifier, a parasitic compensation circuit for compensating for the error voltage induced by the parasitic capacitance, comprising:

third switching means having a first terminal connected to the positive input of the operational amplifier, and a second terminal connected to a reference voltage terminal, said third switching means having substantially the same parasitic capacitance associated therewith as the first switching means, said third switching means selectively coupling the reference voltage terminal to the positive input of the operational amplifier in synchronization with the first switching means connecting the output and the negative input of the operational amplifier; and second charge storage means having a first electrode connected to the positive input of the operational amplifier, and a second electrode connected to the reference voltage terminal, said second charge storage means having substantialy the same charge storage capacity as the first charge storage means, said second charge storage means storing charge associated with the parasitic capacitance of the third switching means and coupling said stored charge to the positive input of the operational amplifier.

4. The auto-zeroed operational amplifier of claim 3 where said first and second charge storge means are first and second capacitors of substantially equal capacitance.

5. A method of compensating voltage errors at an output of an operational amplifier, the output providing an inverted output of an input voltage, said operational amplifier having negative and positive inputs, said voltage errors being attributable to parasitic capacitance coupled to the negative input, comprising the steps of:

coupling a first electrode of a first capacitor and a first terminal of a first switch to the negative input of the operational amplifier;

coupling a second terminal of the first switch to the output of the operational amplifier and coupling a second electrode of the first capacitor to a first terminal of a second switch;

coupling a second terminal of the second switch to the output of the operational amplifier;

coupling a second capactor and a third switch to the positive input of the operational amplifier, for selectively coupling a compensating error voltage to the positive input of the operational amplifier which is substantially equal to the error voltage coupled to the negative input of the operational amplifier, thereby preventing the parasitic capacitance from creating an error voltage at the output of the operational amplifier;

placing the operational amplifier in a unity gain configurtaion by making the first switch conductive to auto-zero the amplifier;

simultaneous to auto-zeroing the operational amplifier, charging the input voltage onto the first capacitor and coupling the positive input of the operational amplifier to a reference voltage terminal;

decoupling the operational amplifier from unity gain configuration and decoupling the positive input from the reference voltage terminal;

decoupling the input voltage from the first capacitor; and coupling the first capacitor between the first input and the output of the operational amplifier to form a feedback loop and provide the inverted output.

6. The method of claim 5 further comprising the step of: making the capacitive values of the first and second capacitors substantially equal.

7. In an operational amplifier circuit, a circuit which is insensitive to error voltages created by inherent parasitic capacitance associated with the circuit, comprising:

an operational amplifier having an inverting input, a noninverting input, and an output;

a first switch having a first terminal connected to the inverting input of the operational amplifier, and a second terminal connected to the output of the operational amplifier, for selectively auto-zeroing the operational amplifier;

a first capacitor having a first electrode connected to the inverting input of the operational amplifier, and a second electrode connected to an input terminal, for selectively receiving and storing an input voltage and a first parasitic error voltage;

a second switch having a first terminal connected to the input terminal, and a second terminal connected to the output of the operational amplifier, for selectively coupling the second electrode of the capacitor to the output;

a third switch having a first terminal connected to the noninverting input of the operational amplifier, and a second terminal connected to a reference voltage terminal, for selectively coupling the operational amplifier to the reference voltage terminal; and a second capacitor having a capacitance substantially equal to the first capacitor and having a first electrode connected to the noninverting input of the operational amplifier and a second electrode connected to the reference voltage terminal, for selectively storing and coupling a second parasitic voltage substantially equal to the first parasitic voltage to the noninverting input of the operational amplifier.

8. The operational amplifier of claim 7 wherein the first, second and third switches are responsive to first, second and third control signals, respectively.

* * * * *